US005512712A

United States Patent [19]

Iwata et al.

[11] Patent Number: 5,512,712
[45] Date of Patent: Apr. 30, 1996

[54] PRINTED WIRING BOARD HAVING INDICATIONS THEREON COVERED BY INSULATION

[75] Inventors: Yutaka Iwata; Ryo Enomoto; Akihito Nakamura; Akihiro Demura, all of Ogaki, Japan

[73] Assignee: Ibiden Co., Ltd., Ogaki, Japan

[21] Appl. No.: 322,872

[22] Filed: Oct. 12, 1994

[30] Foreign Application Priority Data

Oct. 14, 1993 [JP] Japan .................................. 5-256747
Dec. 22, 1993 [JP] Japan .................................. 5-325009

[51] Int. Cl.$^6$ .................................................. H05K 1/02
[52] U.S. Cl. .......................... 174/258; 174/250; 174/255; 361/748
[58] Field of Search ................................... 174/250, 256, 174/258, 255; 361/748; 428/901

[56] References Cited

U.S. PATENT DOCUMENTS

| | | | |
|---|---|---|---|
| 3,697,668 | 10/1972 | Campbell | 174/68.5 |
| 4,682,271 | 7/1987 | Yamada | 361/409 |
| 4,940,627 | 7/1990 | Kittler Jr. et al. | 428/203 |
| 5,093,183 | 3/1992 | Strunka | 428/195 |
| 5,214,566 | 5/1993 | Dupre et al. | 361/392 |

*Primary Examiner*—Laura Thomas
*Attorney, Agent, or Firm*—Steven J. Weissburg

[57] ABSTRACT

Improved printed wiring boards are disclosed, in which indications showing the types of electronic devices to be mounted on the printed wiring boards and other information are provided within the insulation cover coating and are protected from getting accidentally scraped off. Alignment marks are also well protected so that users can always rely on the alignment marks. The surfaces of the printed wiring boards are smooth and flat, which prevents stagnation trouble in a feeding operation of the printed wiring boards as well as helps provide a securer mounting of electronic devices. An improved wiring freedom is also provided.

16 Claims, 3 Drawing Sheets

PRINTED WIRING BOARD HAVING INDICATIONS THEREON COVERED BY INSULATION

BACKGROUND OF THE INVENTION

1. Field of the Invention

The present invention relates to a printed wiring board. More particularly, this invention relates to a printed wiring board having indications thereon that provide information such as the types or kinds of electronic devices to be mounted on the printed wiring board as well as the product information of the printed wiring board and others. This invention also relates to a method for producing such printed wiring boards.

2. Description of the Prior Art

There have previously been proposed printed wiring boards each comprising a substrate, conductor circuits provided on the insulated surface or surfaces of the substrate, and insulation cover coating such as solder resist provided on the substrate to protect the conductor circuits, the insulation cover coatings has colored indications of an insulation ink material comprising letters, marks, numbers or signs providing information of the types or kinds of electronic devices to be mounted on the printed wiring board as well as other information.

In such a prior art printed wiring board, the colored indications are provided on the outer insulation cover coating after the provision of the insulation cover coating on the substrate.

There have also been proposed printed wiring boards, in each of which a portion or portions of the conductor circuits are exposed from the insulation cover coating, serving as an alignment mark for the substrate and/or as connector (mounting) sections for mounting electronic devices on the pointed wiring board.

Such a prior art, printed wiring board as introduced in the above, however, does not provide a good "sliding" performance, an important requirement for smoothly feeding printed wiring boards in a process for mounting electronic devices on the substrates in Express Mail Label No. TB661440538US an automated production line. One reason for the poor "sliding" performance is that the indications printed on the insulation cover coating of a printed wiring board "protrude" from the insulation cover coating, making the surface or surfaces of the printed wiring board "rough" and often prevent smooth automatic feeding of the printed wiring board into an electronic device mounting process by causing friction with other printed wiring boards piled together, thus causing users much trouble. Further, the indications on the printed wiring board may be scraped off partially or wholly by the rubbing caused with other printed wiring boards in such a feeding step or at other times so that users of the printed wiring board are unable to read the indications easily or at all.

Generally, conductor circuits are given a light color, such as golden color, by gilding. Substrate alignment marks prepared by the same gilding are also light colored. Generally, insulation coating has a dark color, such as dark green. Therefore, indications such as letters, marks, numbers and signs provided on insulation coating are light colored, such as in white or yellow, in order to facilitate reading by users against the dark background of the insulation coating. Accordingly, there is often confusion between light colored alignment marks and also light colored indications caused by misrecognition of an indication for an alignment mark, which will result in slow down of manufacturing lines and thus poor productivity.

Conventionally an alignment mark is provided on a substrate in an area between the conductor circuits on the substrate, which reduces the freedom of formation of wiring patterns around the alignment mark. Therefore, "wiring freedom" for conductor circuits is reduced by alignment marks. It may be possible to provide an alignment mark with an insulation material on the insulation cover coating of a substrate to improve "wiring freedom" for conductor circuits, however, such an alignment mark may be lost as indications on the same surface may be lost as described earlier.

Alignment marks are essential in aligning substrates printed wiring boards in manufacturing lines. A lost alignment mark is practically unrecoverable. Therefore, it is essential that "clear" alignment marks are retained on substrates.

Electronic devices such as IC's and LSI's mounted on such a conventional printed wiring board are to be positioned "off" the insulation coating of the printed wiring board by the thickness or height of the indications provided or printed on the insulation coating when there exists an indication or indications beneath such an electronic device. Thus there is made a "considerable" distance between an electronic device mounted on the printed wiring board and the connector section or sections on the substrate where the electronic device is mounted. It is then required to use more solder material between the connector section or sections and the external terminals of the electronic device than when no indication exists beneath the electronic device, and/or it is required to extend the external terminals of the electronic device to come closer to the connector section or sections, both in order to attain a good connection reliability between the external terminals of the electronic device and the connector section or sections.

And, the electronic device will not be mounted in parallel with the substrate or squarely or securely on the printed wiring board if any indication exists under the electronic device, a considerable reduction of the quality of the printed wiring board. In such a situation, very reliable solder connection between the external terminals of the electronic device and the connector section or sections may not be provided. In case the electronic device is a QPF package having many terminals, if more solder material need be used to secure the connection between the terminals of the QPF package and the connector sections, "electrical bridging" may be formed between the terminals, which is fatal to the whole system.

Accordingly, it is an object of the present invention to provide a printed wiring board which can provide an excellent "sliding" property as well as prevent scraping off of the indications as well as the alignment mark or marks provided on the printed wiring board.

It is another object of the present invention to provide a printed wiring board that provides "clear distinction" between an alignment mark or marks and indications.

It is still another object of the present invention to provide a printed wiring board that provides reliable connection between the electronic devices mounted on the printed wiring board and the conductor circuits of the printed wiring board.

It is a further object of the present invention to provide a printed wiring board that provides an improved "wiring freedom" for conductor circuits.

It is another object of the present invention to provide a method of making such printed wiring boards.

SUMMARY OF THE INVENTION

A printed wiring board according to the present invention comprises a substrate each surface of which is provided with an insulation layer, conductor circuits provided on each insulation layer of the substrate, indications such as letters, marks, numbers and/or signs of a colored insulation material provided on each surface of the substrate having the conductor circuits, and light transmittable insulation coating provided on each surface of the substrate having the conductor circuits and the indications.

The indications may include letters such as alphabetic letters, marks such as an alignment mark, numbers and signs, and give information such as the types or kinds of electronic devices to be mounted on the printed wiring board as well as other information such as the product number of the printed wiring board.

The conductor circuits and the indications may be partially covered with the light transmittable insulation coating. An exposed indication portion may serve as an alignment mark of the substrate and an exposed portion or portions of the conductor circuits may serve as connector sections for mounting electronic devices on the printed wiring board. The light transmittable insulation coating may be replaced by non-light transmittable insulation coating under some circumstances if such is desired.

Another printed wiring board according to the present invention includes a substrate having plating resist and conductor circuits provided or formed on the portions where no plating resist exists. The printed wiring board has indications of a colored insulation material printed on the substrate having the plating resist and the conductor circuits. The printed wiring board further has insulation coating provided on the substrate having the plating resist, the conductor circuits and the colored indications.

The insulation coating may partially cover the conductor circuits and the indications. An exposed indication or portion of the indications may serve as an alignment mark for the substrate and an exposed portion or portions of the conductor circuits may serve as connector sections for mounting electronic devices on the printed wiring board. The insulation coating may be a non-light transmittable material under some circumstances if so desired.

A method of producing such printed wiring boards is also disclosed. According to the present invention, the steps of providing plating resist and conductor circuits on a substrate may be performed with an "additive process". A method of producing a printed wiring board according to the present invention may include the steps comprising: applying a photo sensitive liquid resin on a substrate to provide light transmittable insulation coating; and treating the coating material by exposing/developing processes.

Printed wiring boards according to the present invention provide a good surface "slippery" property, an improved "wiring freedom" for conductor circuits and an improved connection reliability with the electronic devices mounted on the printed wiring boards. The printed wiring boards prevent scraping off of the indications including substrate alignment marks on the printed wiring boards as well as prevent confusion between alignment marks and indications.

DESCRIPTION OF THE PREFERRED EMBODIMENTS

Printed wiring boards according to the present invention and a method of making such printed wiring boards will be described with reference to the accompanying drawings.

Figure 1:
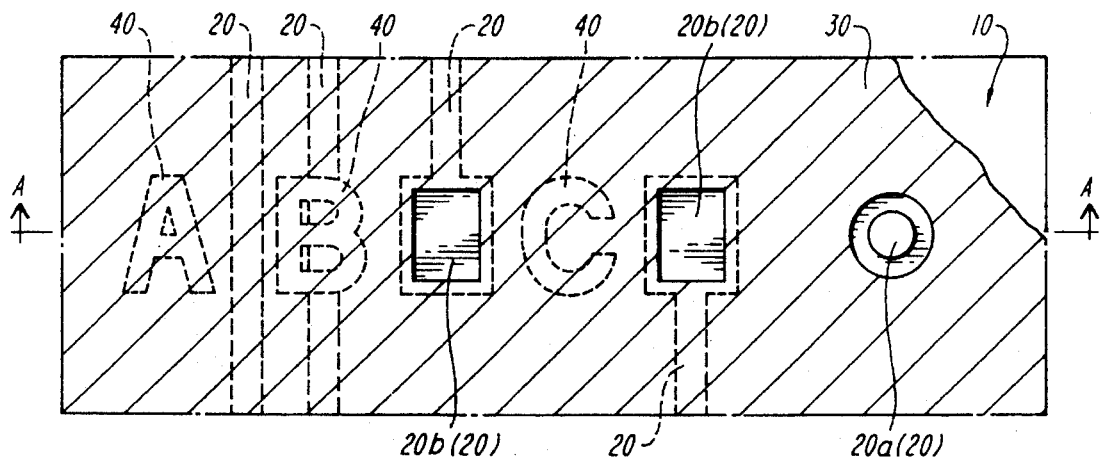
FIG. 1 is a partial plan view showing the top surface of a printed wiring board according to an embodiment of the present invention.

In FIG. 1, a portion of the top surface of a printed wiring board according to an embodiment of the present invention is shown. The printed wiring board comprises a substrate 10 the surfaces of which are insulated, conductor circuits 20 provided on each side of the substrate 10, indications 40 of a colored insulation material provided on the substrate 10 having the conductor circuits 20, and light transmittable insulation coating 30 provided on the substrate 10 having the conductor circuits 20 and the indications 40. The insulation coating 30 is provided after the provision of the indications 40. The insulation coating 30 covers both the conductor circuits 20 (partially) and the indications 40. The indications 40 are colored and the insulation coating 30 is light transmittable.

The indications 40 can (partially) cover the conductor circuits 20 since the indications 40 of an insulation material do not hinder the performance of the conductor circuits 20. The indications 40 may include alphabetic letters, marks, numbers and signs, and provide information of the types or kinds of electronic devices to be mounted on the printed wiring board and other information such as the product number or product mark of the printed wiring board. The indications 40 are usually given a light color to facilitate reading by users through the dark foreground of the insulation coating 30.

In FIG. 1, an alignment mark 20a is shown. The alignment mark 20a is an uncovered (with the insulation coating 30) portion of the conductor circuits 20, which provides a positioning or alignment indication for the substrate 10, an essential element for aligning the substrate 10 in a right position or alignment in manufacturing lines. In the figure, connector sections 20b are also shown. The connector sections 20b are also uncovered (with the insulation coating 30) portions of the conductor circuits 20, which provide mounting means for electronic devices on the printed wiring board.

The indications 40 do not protrude from the insulation coating 30 as the indications 40 are covered with the insulation coating 30. Therefore, the surface of the insulation coating 30 is substantially flat. Since the indications 40 are covered with the insulation coating 30, the indications 40 are well protected from accidental removal by scraping or rubbing. The indications 40 of a light color material can be read through the insulation coating 30 as the insulation coating 30 of a dark color is still light transmittable.

Figure 2:
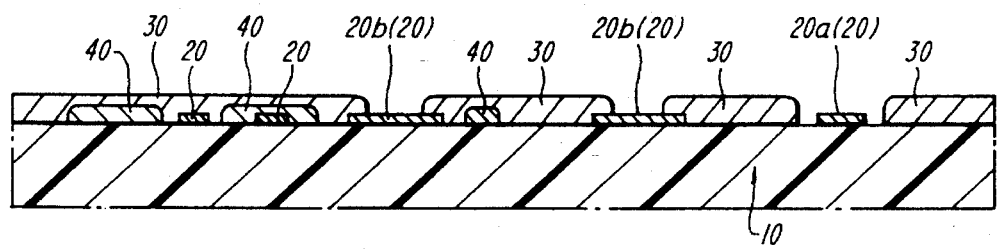
FIG. 2 is a partial sectional view taken along line A—A in FIG. 1, showing the top portion of the printed wiring board.

FIG. 2 is a partial sectional view of the printed wiring board of FIG. 1, taken along line A—A therein, showing the top half or portion of the printed wiring board, As can be seen in the figure, the conductor circuits 20 are partially covered by the insulation coating 30 (and are also partially covered by the indications 40). The indications 40 are also covered by the insulation coating 30. The alignment mark 20a and the connector sections 20b are not (totally) covered by the insulation coating 30.

The substrate 10 is provided with an insulation top layer on each surface thereof (not shown). The substrate 10 may be made of a synthetic resin such as an epoxy resin glass, a ceramic material such as an alumina or aluminum nitride ceramic, or a metal material such as aluminum. The substrate 10 may be a multilayer substrate having an inner conductor circuit layer or layers.

The conductor circuits 20 may be provided, in desired configurations or patterns, with a copper foil or another suitable foil by a conventionally practiced method such as a method including a subtractive process. In this embodiment, gilding by gold is further provided on the conductor circuits 20, giving them an appearance in golden color (light color).

The indications 40 are provided at desired locations on the substrate 10 having the conductor circuits 20. The indications 40 may be provided by screen printing. The indications 40 provide information of the electronic devices to be mounted on the printed wiring board as well as the type or model of the product (printed wiring board) and others. The indications 40 may be an epoxy resin ink or an acrylic resin ink. Or the indications 40 can be a conductive paste, in which case the indications 40 should not be applied on the conductor circuits 20 as such a conductive material hinders the function of the conductor circuits 20.

The indications 40 are given a light color such as white, yellow, gold or silver. The indications 40 may or may not be light transmittable. In case the indications 40 are light transmittable, the color of the indications 40 as seen by users of the printed wiring board becomes a color blended with the color of the substrate surface 10 and the color of the insulation coating 30.

The insulation coating 30 is provided on each side of the substrate 10 covering the conductor circuits 20 partially and the indications 40. It is preferred that the insulation coating 30 is light transmittable so that users of the printed wiring board can see the indications 40 through the insulation coating 30. The insulation coating 30 may be colored in deep green, green, black, blue, red, brown, etc., however, such insulation coating 30 need still be light transmittable enough to facilitate reading of the indications 40 according to this preferred embodiment.

Light transmittable insular, ion coating 30 may be provided on the substrate 10 by appropriately applying a desired amount of a light transmittable heat-curing resin on a substrate 10 having conductor circuits 20 and indications 30 thereon and by heating the resin to cure. Such insulation coating 30 may be provided by a printing process. Such insulation coating 30 may be provided by appropriately pasting a light transmittable filmy resin on the substrate 10 having conductor circuits 20 and indicators 30. However, it is preferred to provide insulation coating 30 on the substrate 10 by using a photo-sensitive liquid resin and appropriately treating the liquid resin to cure. Advantages of using a photo-sensitive liquid resin include, among others: (1) improved capability of properly covering an uneven or rough surface such that the covered surface may become even or flat; (2) improved configuration precision of the covered surface 30; and (3) improved property of the printed wiring board. Such a photo-sensitive insulation coating 30 may be a photo-sensitive acrylic resin or a photo-sensitive epoxy resin.

The indications 40 are preferably 10–20 μm thick, and the insulation coating 30 is preferably 10–30 μm thick. It is desirable that the insulation coating 30 is thicker than the indications 40.

If insulation coating 30 is provided thinner than 10 μm, it may not completely or adequately cover the indications 40. On the other hand, if insulation coating 30 is provided thicker than 30 μm, the distance of the exposed portions 20b (not covered with the insulation coating 30) from the external terminals of a mounted electronic device becomes "too" great, necessitating use of an "increased" amount of solder material between the connector sections 20b and the external terminals of the device, or requiring an extension of the external terminals of the electronic device, which are both disadvantageous to the performance of the whole system (printed wiring board and electronic devices).

If indications 40 are provided thinner than 10 μm, appropriate forming of such indications 40 on a substrate 10 becomes harder. There may also arise difficulty in reading such indications 40 because such "thin" indications would not be perfectly shaped or would not carry a recognizable color. On the other hand, if the thickness of indications 40 is over 20 μm, the top surface covered by the insulation coating 30 will become uneven or rough.

When the thickness of the insulation coating 30 and that of the indications 40 on a substrate 10 are both appropriate, electronic devices can be evenly (horizontally or parallel with the surfaces of the substrate 10) and squarely or securely mounted on the substrate 10, a great advantage to the quality and property of the whole system.

Figure 3:
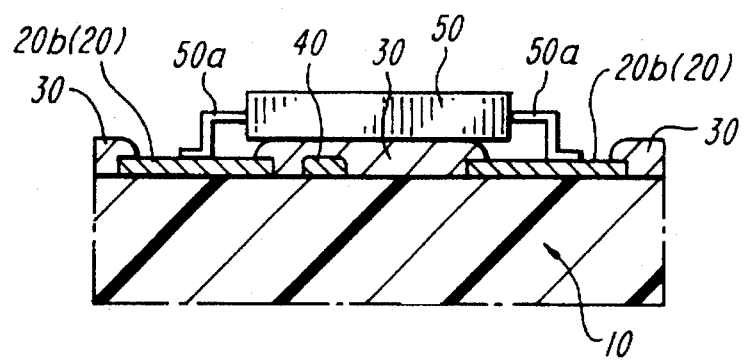
FIG. 3 is a partial sectional view of the printed wiring board of FIG. 1, showing an electronic device mounted thereon.

As shown in FIG. 3, an electronic device 50 is mounted in substantially "perfect" contact with the insulation coating 30 even though there is an indication 40 underneath enclosed in the insulation coating 30. There will not be any necessity to disadvantageously increase the amount of solder material for connecting the external terminals 50a of the device 50 and the connector sections 20b, or to extend the external terminals 50a of the electronic device 50 disadvantageously to reach the connector sections 20b.

As described earlier (FIGS. 1 and 2), an alignment mark 20a is provided on each side of the substrate 10 to serve for aligning the substrate 10 properly in a manufacturing process. The alignment mark 20a, a portion of the conductor circuits 20, is exposed. Thus, the alignment mark 20a can be clearly distinguished from the indications 40 of different material and color on the same surface of a printed wiring board.

Figure 4:
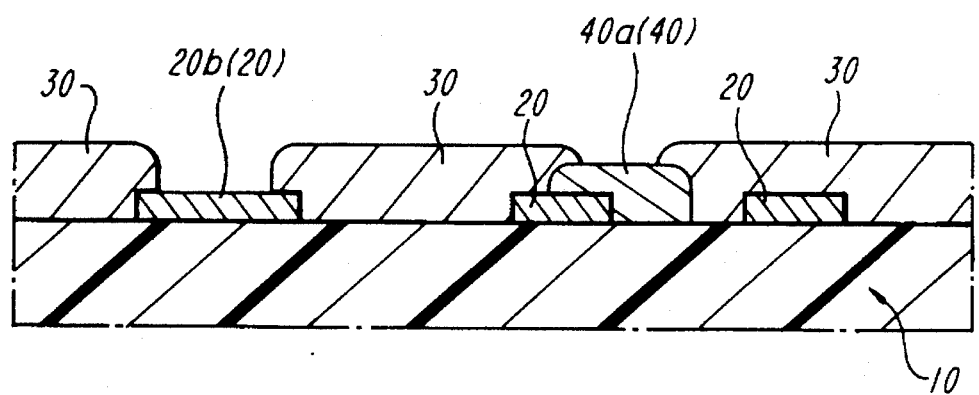
FIG. 4 is a partial sectional view showing the top portion of a printed wiring board according to another embodiment of the present invention.

FIG. 4 shows a printed wiring board according to another embodiment of the present invention. A substrate alignment mark 40a is the uncovered (by insulation coating 30) portion of indications 40. By such constitution, "freedom of wiring" for conductor circuits 20 improves as conductor circuits 20 can be "freely" distributed on a substrate 10. An uncovered or exposed alignment mark 40a can be clearly distinguished from indications 40 covered with insulation coating 30 since the color of the alignment mark 40a is different from the color of the (other) indications 40 as seen through the insulation coating 30.

Here in this embodiment, all the features such as materials, making and format ion of the substrate 10, conductor circuits 20, indications 40 and insulation coating 30 may be the same as the features of the earlier embodiment except that a portion of the indications 40 is used as an alignment mark 40a instead of the alignment mark 20a prepared from the conductor circuits 20.

In this embodiment as in the previous embodiment, it should be noted that the insulation coating 30 may not be light transmittable if the indications 40 including the alignment mark 40a are desired not to be (totally) covered by the insulation coating 30.

In this embodiment, portions of the conductor circuits 20 are exposed. The exposed portions 20b of the conductor circuits 20 are used as connector sections 20b as described earlier.

As such an alignment mark 40a and connector sections 20b are concurrently prepared at the time of providing indications 40 on a substrate 10, the relative locations of the connector sections 20b and the alignment mark 40a on the substrate 10 can be more precisely determined. Accordingly, electronic devices 50 can be mounted on such a printed wiring board more precisely with the assistance of the more precisely located alignment mark 40a.

Provision of an alignment mark 40a as such provides an improved "freedom of wiring" for conductor circuits 20, an improvement over the afore-described alignment mark 20a, since the alignment mark 20a is a part of conductor circuits 20, limiting the "freedom of wiring" on a substrate 10, while the alignment mark 40a of an insulation material can be provided even on the conductor circuits 20 without hindering the function of the conductor circuits 20.

Another advantage of providing such alignment marks 40a is that there is no losing or removal of the alignment marks 40a during a feeding step of printed wiring boards having such alignment marks 40a for mounting electronic devices, as the alignment marks 40a are formed beneath the surface of the insulation coating 30, which prevents the alignment marks 40a from touching the surfaces of other printed wiring boards when piled.

The alignment mark 40a is exposed so that the surface color of the alignment mark 40a is the color of the indications 40. When the insulation coating 30 is colored (in a color other than that of the indications 40) and still light transmittable, the resulting color of the indications 40 as seen through the insulation coating 30 becomes a blended one. Therefore, the alignment mark 40a (the color of the indications 40) can be clearly distinguished from the (other) indications 40 of a blended color.

In the printed wiring board according to this embodiment and the printed wiring board described earlier (FIGS. 1–3), the connector sections 20b are covered by the insulation coating 30 on all sides or around except an inner portion thereof. Therefore, the connector sections 20b are given a substantial resistance against removal from the substrate 10, which is an advantage especially when repairing of an electronic device mounted on the connector sections 20b, such as by resoldering, is required.

Such printed wiring boards (FIGS. 1–4) may be produced by "reordering" a conventionally practiced production steps, each step being known and practiced widely in the art.

Figure 5:
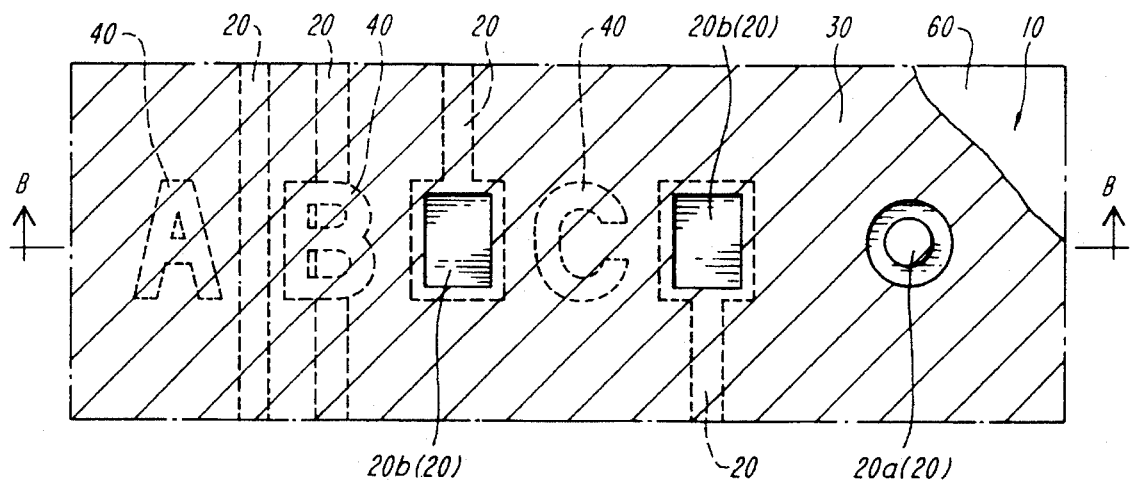
FIG. 5 is a partial plan view showing the top surface of a printed wiring board according to another embodiment of the present invention.

In FIG. 5 is partially shown the top side of a printed wiring board according to another embodiment of the present invention, wherein plating resist 60 and conductor circuits 20 are provided on a substrate 10, possibly, by an additive process. The conductor circuits 20 are formed on the substrate 10 where the plating resist 60 does not exist. Thus, the surface of the substrate 10 is covered with the plating resist 60 and the conductor circuits 20. The conductor circuits 20 and the plating resist 60 may provide a "substantially" plane surface.

The plating resist 60 and the conductor circuits 20 can be provided by an appropriate surface treatment process such as an additive process including the steps of (1) applying an additive adhesive, (2) exposing the additive adhesive, (3) developing the exposed adhesive, (4) treating the developed adhesive with an appropriate acid such as chromic acid, (5) providing a catalytic nucleus, (6) activating the catalytic nucleus, and (7) electrolessly plating the surface.

Indications 40 are provided &s desired on the substantially plane surface of the plating resist 60 and the conductor circuits 20. Then, light transmittable insulation coating 30 covers the substrate 10 having the plating resist 60, the conductor circuits 20 and the indications 40.

The "surface" provided by the plating resist 60 and the conductor circuits 20 may not be "perfectly" plane. However, it is desirable to adjust the thickness or height of the conductor circuits 20, for instance, by controlling the plating time, so that the height of the conductor circuits 20 may be as close as the height of the plating resist 60. At any rate, the difference in thickness or height between the conductor circuits 20 and the plating resist 60 is preferred to be less than 8 μm. If the difference is bigger than that, it may become hard to read the indications 40 to be provided on the surface since the indications 40 will not be provided evenly or flatly on such an uneven surface.

Here in this embodiment, the materials for all such component members may be the same as the materials usable for the previous embodiments.

Figure 6:
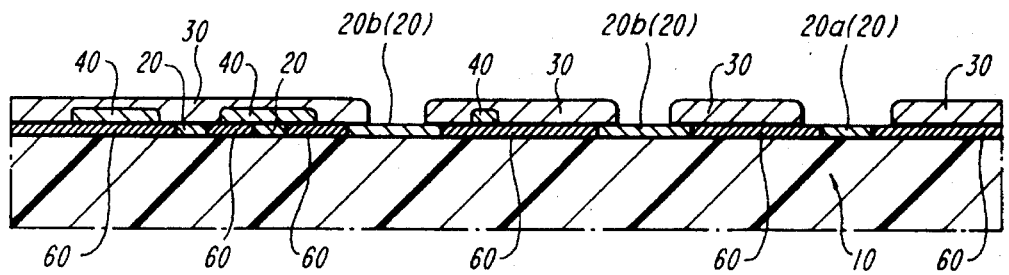
FIG. 6 is a partial sectional view taken along line B—B in FIG. 5, showing the top portion of the printed wiring board.

FIG. 6 is a partial sectional view of the top portion of the printed wiring board of FIG. 5, taken along line B—B. Portions of the conductor circuits 20 are exposed and serve as an alignment mark 20a and connector sections 20b as defined earlier.

The top surface of the insulation coating 30 is substantially flat, practically diminating the possibility of the printed wiring board getting stuck in a feeding step due to the scraping or friction with other printed wiring boards. The indications 40 are totally under the insulation coating 30 and there will be no scraping off of the indications 40. Electronic devices can be squarely and securely mounted on the printed wiring board.

The alignment mark 20a is secured in place by the plating resist 60 and will not be lost. The connector sections 20b are also secured in place by the plating resist 60 and will not be lost or removed even when repairing of the mounting condition of an electronic device is required. The alignment mark 20a can be clearly distinguished from the indications 40 as the color of the alignment mark 20a is different from the color of the indications 40 which is seen through the insulation coating 30.

Figure 7:
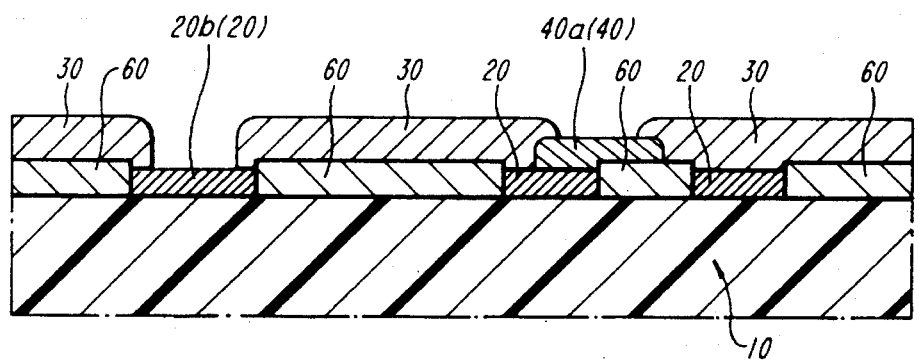
FIG. 7 is a partial sectional view showing the top portion of a printed wiring board according to another embodiment of the present invention.

In FIG. 7 is shown a partial sectional view of a printed wiring board according to another embodiment of the present invention. A portion of the indications 40 is exposed and used as an alignment mark 40a as defined earlier. Portions of the conductor circuits 20 are also exposed and used as connector sections 20b as defined earlier.

Here in this embodiment again, the materials to be used as the substrate 10, plating resist 60, conductor circuits 20, indications 40 and insulation coating 30 may be the same as the materials used in the other embodiments.

The top surface of the insulation coating 30 is substantially flat. Again, electronic devices can be squarely and securely mounted on the printed wiring board. The indications 40 are well protected by the insulation coating 30. The indications 40 can be distinguished from the alignment mark 40a as the color of the alignment mark 40a is substantially different from the color of the indications 40 as seen through the light transmittable insulation coating 30, which is a blend color.

The alignment mark 40a is secured in position by the insulation coating 30. The connector sections 20b are also secured in position by the plating resist 60.

Such a printed wiring board can be produced by changing the order of conventionally and widely practiced production steps for conventional printed wiring boards.

It is desirable that the surface or surfaces of a printed wiring board in all the embodiments described according to the present invention be provided with a surface treatment such as fine grinding. The thickness of the insulation coating 30, and thus the whole thickness of the printed wiring board, can be further and finely adjusted by such a surface grinding treatment.

Such a grinding treatment will not erase the indications 40 of the present invention as the indications 40 are protect, ed by the insulation coating 30. However, when the surface coating 30 is light transmittable, as preferred according to the present invention, care need be practiced not to damage the light transmittance of the insulation coating 30. Or materials of the insulation coating 30 should be carefully selected to avoid such damage to take place.

Constructed as such, printed wiring boards in accordance with the present invention provide many advantages over conventional printed wiring boards, among others such as:

(a) providing smoother surfaces, preventing stagnation trouble in feeding operations of such printed wiring boards;

(b) providing a better protection of the indications such as letters, marks, numbers and signs that provide information for the printed wiring boards so that the indications may stay permanently readable on the printed wiring boards;

(c) providing a better protection of the substrate alignment marks from removal so that the alignment marks may stay permanently recognizable on the printed wiring boards;

(d) providing connector sections on the substrates closer to the electronic devices mounted on the printed wiring boards so that a lesser amount of solder material may be sufficient or shorter external terminals may be sufficient;

(e) providing electronic devices more precisely and securely on the printed wiring boards, which is partially made possible by the flat outer surfaces of the printed wiring boards under which the indications are buried;

(f) providing more distinguishable alignment marks so that the alignment marks are easily and without confusion recognizable, eliminating manufacturing trouble;

(g) providing a last stage adjustment of the thickness of printed wiring boards by a surface treatment so that the printed wiring boards may be made more precisely in size; and (h) providing an improvement in "wiring freedom" for conductor circuits on substrates.

While the foregoing invention has been described with reference to its preferred embodiments, various modifications and alterations will occur to those skilled in the art. All such air, orations and modifications are intended to fall within the scope of the appended claims.

What is claimed is:

1. A printed wiring board comprising a substrate, conductor circuits provided on each insulated surface of said substrate, indications of a colored insulation material provided on each surface of said substrate having said conductor circuits thereon, and light transmittable insulation coating provided on each surface of said substrate having said conductor circuits and said indications thereon.

2. A printed wiring board comprising a substrate provided with plating resist, conductor circuits provided on said substrate where no plating resist exists, indications of a colored insulation material provided on said substrate having said plating resist and said conductor circuits thereon, and insulation coating provided on said substrate having said plating resist, said conductor circuits and said indications thereon.

3. A printed wiring board according to claim 2, wherein a difference in height between said plating resist and said conductor circuits is less than 8 μm.

4. A printed wiring board according to claim 1, wherein a portion of said conductor circuits is exposed.

5. A printed wiring board according to claim 1, wherein inner portions of conductor circuits are exposed and made connector sections for use in mounting an electronic device or electronic devices.

6. A printed wiring board comprising a substrate each surface of which is provided with an insulation layer, conductor circuits provided on each surface of said substrate having said insulation layer thereon, indications of a colored insulation material provided on each surface of said substrate having said insulation layer and said conductor circuits thereon, and insulation coating provided on each surface of said substrate having said insulation layer, said conductor circuits and said indications thereon, such that at least one portion of said indications is exposed.

7. A printed wiring board comprising a substrate provided with plating resist, conductor circuits provided on said substrate where no plating resist exists, indications of a colored insulation material provided on said substrate having said plating resist and said conductor circuits thereon, and insulation coating provided on said substrate having said plating resist, said conductor circuits and said indications thereon, such that at least one portion of said indications is exposed.

8. A printed wiring board according to claim 7, wherein a difference in height between said plating resist and said conductor circuits is less than 8 μm.

9. A printed wiring board according to claim 6, wherein said at least one portion of said indications is made an alignment mark for use in alignment of said substrate.

10. A printed wiring board according to claim 6, wherein portions of said conductor circuits are exposed and made connector sections for use in mounting an electronic device or electronic devices.

11. A printed wiring board according to claim 1, wherein a thickness of said indications is 10 to 20 μm, and a thickness of said insulation coating is 10 to 30 μm, such that said insulation coating is thicker than said indications.

12. A method of making a printed wiring board comprising the steps of:

(a) providing conductor circuits on each insulated surface of a substrate;

(b) providing, indications of a colored insulation material on each surface of said substrate having said conductor circuits thereon; and (c) providing, insulation coating of a light transmittable material on each surface of said substrate having said conductor circuits and said indications thereon.

13. A method of making a printed wiring board comprising the steps of:

(a) providing plating resist and conductor circuits on a substrate by an additive process;

(b) providing, indications of a colored insulation material on said substrate having said conductor circuits thereon; and (c) providing, insulation coating of a light transmittable material on said substrate having said conductor circuits and said indications thereon.

14. A method of making a printed wiring board comprising the steps of:

(a) providing conductor circuits on each insulated surface of a substrate;

(b) providing, indications of a colored insulation materal on said substrate having said conductor circuits thereon; and (c) providing, insulation coating on said substrate having said conductor circuits and said indications thereon such that at least one portion of said indications is exposed.

15. A method of making a printed wiring board comprising the steps of:

(a) providing plating resist and conductor circuits on a substrate by an additive process;

(b) providing, indications of a colored insulation material on said substrate having said plating resist and said conductor circuits thereon; and (c) providing, insulation coating on said substrate having said plating resist, said conductor circuits and said indications thereon such that at least one portion of said indications is exposed.

16. A method of making a printed wiring board according to claim 12, wherein said insulation coating is a photosensitive liquid resin, which is treated in steps including exposure and development steps.

* * * * *